(12) United States Patent
Park et al.

(10) Patent No.: US 8,836,142 B2
(45) Date of Patent: Sep. 16, 2014

(54) SEMICONDUCTOR DEVICES

(71) Applicant: Samsung Electronics Co., Ltd., Suwon-si (KR)

(72) Inventors: Yeun-Sang Park, Yongin-si (KR); Byung-Lyul Park, Seoul (KR); SungHee Kang, Seongnam-si (KR); Taeseong Kim, Suwon-si (KR); Kwangjin Moon, Hwaseong-si (KR); Sukchul Bang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/911,569

(22) Filed: Jun. 6, 2013

(65) Prior Publication Data

US 2014/0008815 A1 Jan. 9, 2014

(30) Foreign Application Priority Data

Jul. 5, 2012 (KR) .................. 10-2012-0073432

(51) Int. Cl.
*H01L 23/52* (2006.01)
*H01L 23/528* (2006.01)
*H01L 23/48* (2006.01)

(52) U.S. Cl.
CPC ..... *H01L 23/481* (2013.01); *H01L 2224/48227* (2013.01); *H01L 2224/48091* (2013.01); *H01L 2224/73257* (2013.01); *H01L 2924/15311* (2013.01); *H01L 2224/16225* (2013.01); *H01L 2224/16145* (2013.01)
USPC .................. 257/774; 257/E23.145

(58) Field of Classification Search
None
See application file for complete search history.

(56) References Cited

U.S. PATENT DOCUMENTS

| | | | |
|---|---|---|---|
| 7,112,887 B2 | 9/2006 | Swan et al. | |
| 7,199,050 B2 * | 4/2007 | Hiatt | 438/667 |
| 7,417,325 B2 | 8/2008 | Farnworth et al. | |
| 7,517,798 B2 | 4/2009 | Tuttle | |
| 7,800,238 B2 * | 9/2010 | Pratt | 257/777 |
| 7,952,171 B2 | 5/2011 | Pratt | |
| 8,178,977 B2 * | 5/2012 | Kawashita et al. | 257/774 |
| 8,629,057 B2 * | 1/2014 | Kirby et al. | 438/638 |
| 8,637,937 B2 * | 1/2014 | Andry et al. | 257/382 |
| 2002/0047210 A1 * | 4/2002 | Yamada et al. | 257/774 |
| 2007/0045779 A1 * | 3/2007 | Hiatt | 257/621 |
| 2008/0136038 A1 * | 6/2008 | Savastiouk et al. | 257/774 |
| 2009/0283898 A1 * | 11/2009 | Janzen et al. | 257/698 |
| 2010/0330798 A1 | 12/2010 | Huang et al. | |
| 2011/0068466 A1 | 3/2011 | Chen et al. | |
| 2011/0204505 A1 | 8/2011 | Pagaila et al. | |
| 2011/0233777 A1 | 9/2011 | Akram et al. | |

* cited by examiner

*Primary Examiner* — Thomas L Dickey
*Assistant Examiner* — Joseph Schoenholtz
(74) *Attorney, Agent, or Firm* — Myers Bigel Sibley & Sajovec, P.A.

(57) ABSTRACT

Semiconductor devices are disclosed. The semiconductor device may include a semiconductor substrate having a first surface and a second surface opposite to each other and a pad trench formed at a portion of the second surface, a through-electrode penetrating the semiconductor substrate and protruding from a bottom surface of the pad trench. A buried pad may be disposed in the pad trench and may surround the through-electrode.

16 Claims, 16 Drawing Sheets

SEMICONDUCTOR DEVICES

CROSS-REFERENCE TO RELATED APPLICATIONS

This U.S. non-provisional patent application claims priority under 35 U.S.C. §119 to Korean Patent Application No. 10-2012-0073432, filed on Jul. 5, 2012, the entirety of which is incorporated by reference herein.

BACKGROUND

The inventive concept relates to semiconductor devices, more particularly, to semiconductor devices including a through-electrode.

Semiconductor devices are widely used in high performance electronic systems. A capacity and an operation speed of the semiconductor devices have been increased. Thus, various researches have been conducted for integrating various functions in small semiconductor device and for fast driving the semiconductor device.

A through-silicon via (TSV) partially or fully penetrating a semiconductor chip may be used for communication between semiconductor chips stacked for high integration or between a semiconductor chip and an external system.

SUMMARY

Embodiments of the inventive concept may provide semiconductor devices with improved reliability.

In one aspect, a semiconductor device may include: a semiconductor substrate having a first surface and a second surface opposite to each other and a pad trench formed at a portion of the second surface; a through-electrode penetrating the semiconductor substrate and protruding from a bottom surface of the pad trench; and a buried pad disposed in the pad trench and surrounding the through-electrode.

In an embodiment, an exposed surface of the buried pad may be substantially coplanar with an exposed surface of the through-electrode at the second surface of the semiconductor substrate.

In an embodiment, the semiconductor device may further include: a via-insulating layer disposed between the through-electrode and the semiconductor substrate and between the buried pad and the through-electrode.

In an embodiment, the semiconductor device may further include: a pad insulating layer disposed between the buried pad and the semiconductor substrate. The pad insulating layer may extend between the through-electrode and the buried pad.

In an embodiment, the buried pad may include a pad barrier layer and a pad metal layer sequentially formed in the pad trench.

In an embodiment, the semiconductor device may further include: a first conductive pad being in contact with the through-electrode on the first surface of the semiconductor substrate; and a second conductive pad being in contact with the through-electrode and the buried pad on the second surface of the semiconductor substrate.

In an embodiment, the through-electrode may have a pipe-shape in which a semiconductor pillar spaced apart from the semiconductor substrate is disposed; and the buried pad may surround an inner sidewall and an outer sidewall of the through-electrode. Here, a height of the semiconductor pillar may be smaller than a height of the through-electrode.

In another aspect, a semiconductor device may include: a through-electrode penetrating a semiconductor substrate; and a conductive pad structure being in contact with a top surface of the through-electrode on the semiconductor substrate and surrounding a portion of a sidewall of the through-electrode.

In an embodiment, a top surface of the conductive pad structure may be disposed to be higher than one surface of the semiconductor substrate; and a bottom surface of the conductive pad structure may be disposed to be lower than the one surface of the semiconductor substrate.

In an embodiment, the conductive pad structure may comprise a buried portion and a pad portion. The buried portion of the conductive pad structure may be buried in the semiconductor substrate to surround the portion of the sidewall of the through-electrode; and the pad portion of the conductive pad structure may be in contact with a top surface of the through-electrode and a top surface of the buried portion.

In an embodiment, a width of the pad portion may be substantially equal to or greater than a width of the buried portion.

In an embodiment, the conductive pad structure may further comprise a pad insulating layer and a via-insulating layer. The pad insulating layer may be disposed between the buried portion and the semiconductor substrate; and the via-insulating layer may be disposed between the through-electrode and the semiconductor substrate and between the buried portion and the through-electrode.

In an embodiment, a top surface of the semiconductor substrate may be substantially coplanar with a top surface of the through-electrode.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept. The inventive concept will become more apparent in view of the attached drawings and accompanying detailed description.

DETAILED DESCRIPTION OF THE EMBODIMENTS

Figure 1:
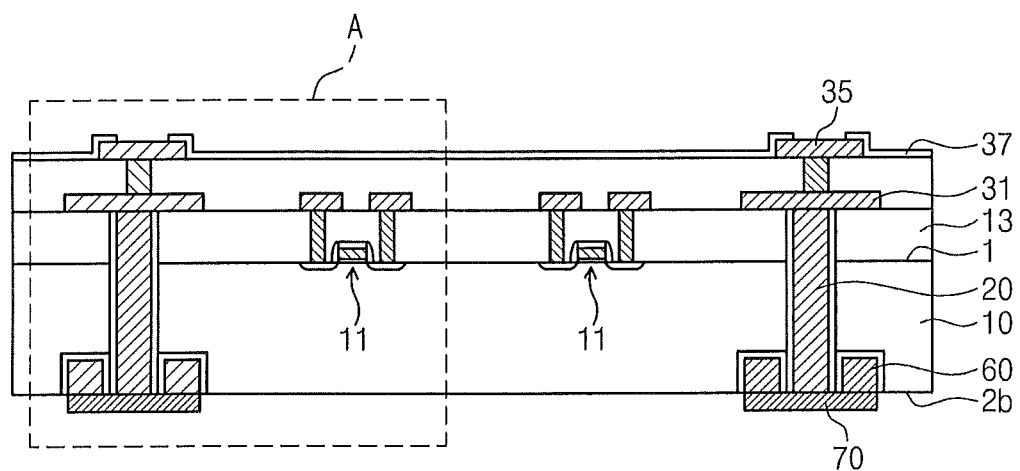
FIG. 1 is a cross-sectional view illustrating a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, semiconductor devices according to some embodiments of the inventive concept will be described with reference to FIGS. 1 to 7.

Figure 2:
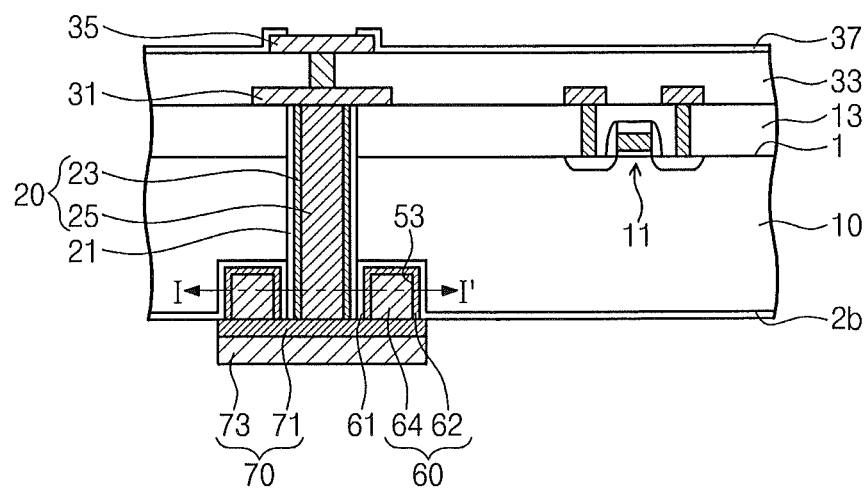
FIG. 2 is an enlarged view of a portion 'A' of FIG. 1.

FIG. 1 is a cross-sectional view illustrating a semiconductor device according to some embodiments of the inventive concept. FIG. 2 is an enlarged view of a portion 'A' of FIG. 1, and FIG. 3 is a plan view taken along a line I-I' of FIG. 2.

Figure 3:
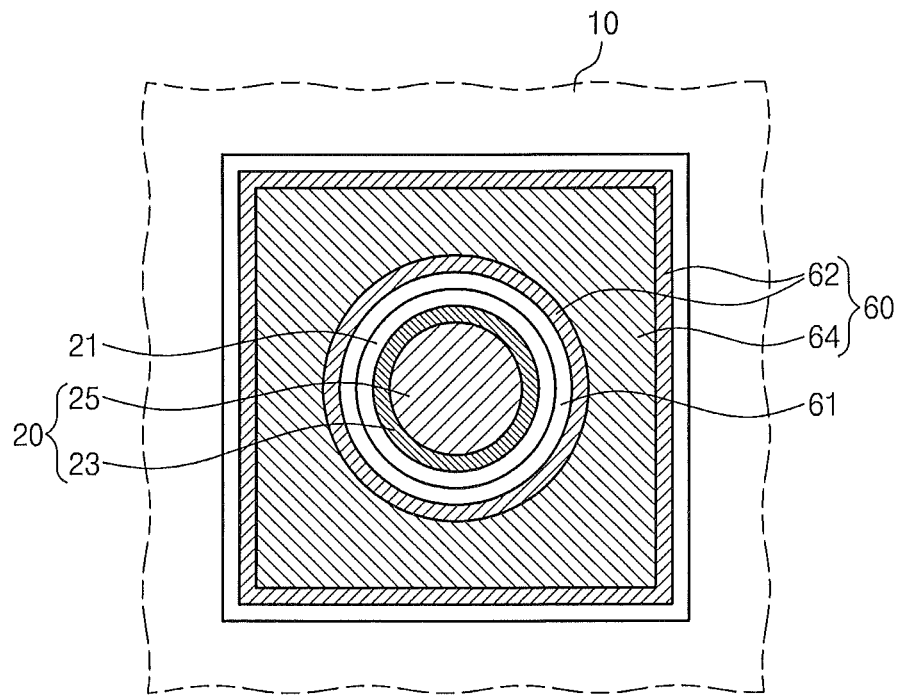
FIG. 3 is a plan view taken along a line I-I' of FIG. 2.

Referring to FIGS. 1, 2, and 3, a semiconductor substrate 10 includes a first surface 1 and a second surface 2b opposite to each other.

Integrated circuits 11 may be disposed on the first surface 1 of the semiconductor substrate 10. The integrated circuits 11 may include stacked fine electronic elements capable of realizing high capacity, high integration, and a high system. For example, a memory element, a core circuit element, a peripheral circuit element, a logic circuit element, and/or a control circuit element may be disposed on the first surface 1 of the semiconductor substrate 10.

A first interlayer insulating layer 13 may be disposed on the first surface 1 of the semiconductor substrate 10 to cover the integrated circuits 11. The first interlayer insulating layer 13 may include conductive patterns electrically connected to the integrated circuits 11.

Through-electrodes 20 may penetrate the first interlayer insulating layer 13 and the semiconductor substrate 10. The through-electrodes 20 may be spaced apart from the integrated circuits 11. In some embodiments, each of the through-electrodes 20 may have a pillar-shape.

Referring to FIGS. 2 and 3, the through-electrode 20 may include a barrier layer 23 and a metal layer 25. Additionally, the through-electrode 20 may further include a seed layer (not shown) disposed between the barrier layer 23 and the metal layer 25.

The barrier layer 23 may include titanium, titanium nitride, tantalum, tantalum nitride, ruthenium, cobalt, manganese, tungsten nitride, nickel, nickel boride, a double layer such as titanium/titanium nitride, and/or any combination thereof. The barrier layer 23 may prevent the metal in the through-electrode 20 from being diffused into the semiconductor substrate 10. The metal layer 25 may include at least one of silver (Ag), gold (Au), copper (Cu), aluminum (Al), tungsten (W), and indium (In).

A via-insulating layer 21 may be disposed between the through-electrode 20 and the semiconductor substrate 10 and between the through-electrode 20 and the first interlayer insulating layer 13. The via-insulating layer 21 may extend to be disposed over the integrated circuits 11. The via-insulating layer 21 may be single-layered or multi-layered. For example, the via-insulating layer 21 may include silicon oxide, silicon oxynitride, silicon nitride, and/or any combination thereof. In other embodiments, the via-insulating layer 21 may include a polymer layer.

An internal interconnection 31 may be disposed on the first interlayer insulating layer 13. The internal interconnection 31 may electrically connect the through-electrode 20 to the integrated circuits 11. The internal interconnection 31 may include at least one of aluminum (Al), copper (Cu), and tungsten (W).

A second interlayer insulating layer 33 may be disposed on the first interlayer insulating layer 13 to cover the internal interconnection 31. A first connecting pad 35 may be disposed on the second interlayer insulating layer 33. The first connecting pad 35 may be electrically connected to the through-electrode 20 through the internal interconnection 31. The first connecting pad 35 may include a metal such as copper (Cu).

A passivation layer 37 may be disposed on the second interlayer insulating layer 33 and the first connecting pad 35. The passivation layer 37 may protect the integrated circuits 11 from an external environment. The passivation layer 37 may expose a portion of the first connecting pad 35 for electrical connection to another semiconductor device as illustrated in FIGS. 1 and 2. The passivation layer 37 may include silicon oxide, silicon nitride, a polymer layer (e.g., polyimide), and/or any combination thereof.

In some embodiments, a buried pad 60 may be disposed at the second surface 2b of the semiconductor substrate 10. The buried pad 60 may be buried in the semiconductor device 10 and surround the through-electrode 20.

In more detail, referring to FIGS. 2 and 3, the semiconductor substrate 10 may include a pad trench 53 recessed from a portion of the second surface 2b into the semiconductor substrate 10. The buried pad 60 may be disposed in the pad trench 53. In some embodiments, surfaces of the buried pad 60 and the through-electrode 20, which are exposed at the second surface 2b of the semiconductor substrate 10, may be substantially coplanar with each other. The buried pad 60 may include a pad barrier pattern 62 and a pad metal pattern 64. In some embodiments, the buried pad 60 may have a thickness within a range of about 2 μm (micrometer) to about 3 μm. In FIG. 3, the buried pad 60 may have a quadrilateral shape in a plan view. However, the inventive concept is not limited thereto. The buried pad 60 may have a circular shape, an octagonal shape, and/or a hexagonal shape in a plan view. Thus, the buried pad 60 including a metal material may surround a portion of the through-electrode 20 in the pad trench 53, so that it is possible to prevent the through-electrode 20 from bending or breaking.

Additionally, a pad insulating layer 61 may be disposed between the buried pad 60 and the semiconductor substrate 10. The pad insulating layer 61 may extend between the buried pad 60 and the via-insulating layer 21. Furthermore, the pad insulating layer 61 may further extend onto the second surface 2b of the semiconductor substrate 10. The pad insulating layer 61 may prevent the metal material of the buried pad 60 from being diffused into the semiconductor substrate 10. For example, the pad insulating layer 61 may include silicon oxide, silicon oxynitride, silicon nitride, and/or any combination thereof.

In some embodiments, a second connecting pad 70 may be disposed on the second surface 2b of the semiconductor substrate 10. The second connecting pad 70 may be in contact with the through-electrode 20 and the buried pad 60. The buried pad 60 formed of the metal material may provide stable electrical connection between the second connecting pad 70 and the through-electrode 20.

The second connecting pad 70 may include a pad seed layer 71 and a pad metal layer 73 which are sequentially stacked on the surface of the buried pad 60 and the through-electrode 20 substantially coplanar with each other. The pad seed layer 71 may include an alloy layer formed of Ti/Cu, Ti/Pd, Ti/Ni, Cr/Cu, and/or any combination thereof. The pad metal layer 73 may be formed of a metal or metal alloy including at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and/or carbon (C).

Figure 4:
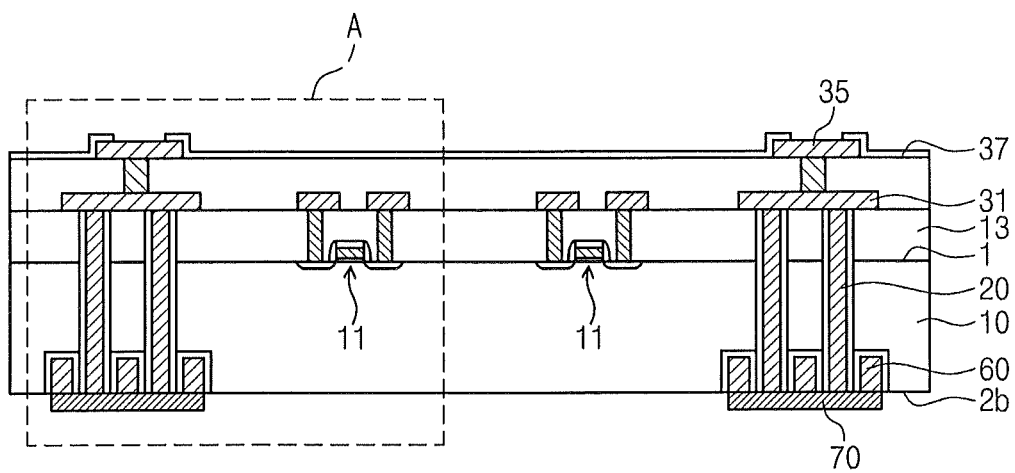
FIG. 4 is a cross-sectional view illustrating a semiconductor device according to other embodiments of the inventive concept.
Figure 5:
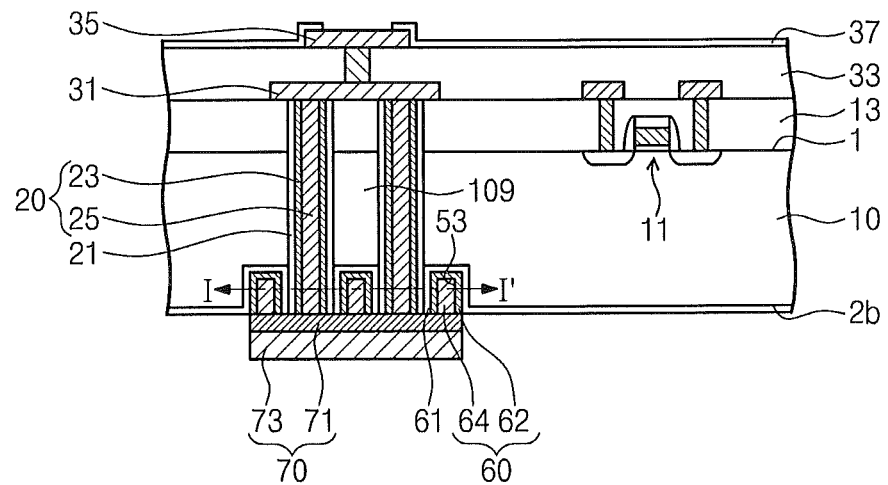
FIG. 5 is an enlarged view of a portion 'A' of FIG. 4.
Figure 6:
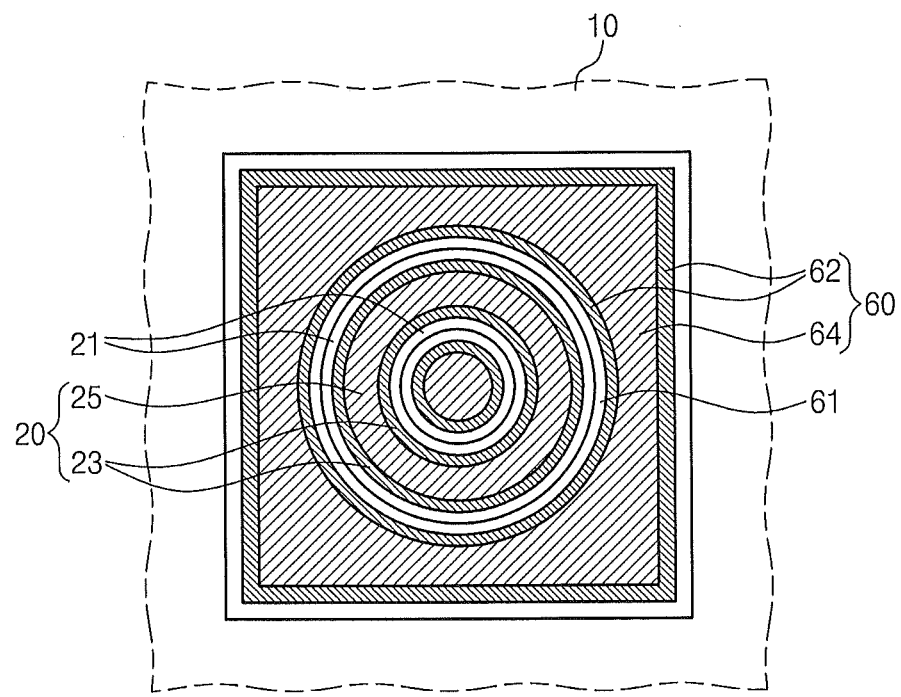
FIG. 6 is a plan view taken along a line I-I' of FIG. 5.

FIG. 4 is a cross-sectional view illustrating a semiconductor device according to some other embodiments of the inventive concept. FIG. 5 is an enlarged view of a portion 'A' of FIG. 4. FIG. 6 is a plan view taken along a line I-I' of FIG. 5.

Referring to FIGS. 4, 5, and 6, a through-electrode 20 may have a planar cross section of a ring-shape. In other words, the through-electrode 20 may have a pipe-shape. Thus, an isolated semiconductor pillar 109 separated from the semiconductor substrate 10 may be disposed in an inner space of the through-electrode 20. In other words, the semiconductor pillar 109 may be surrounded by the through-electrode 20.

In the present embodiment, the semiconductor substrate 10 may have a pad trench 53 exposing an outer sidewall part and an inner sidewall part of the through-electrode 20. In the present embodiment, a buried pad 60 may surround an inside and an outside of the through-electrode 20. In other words, the buried pad 60 may surround a portion of the inner sidewall part and a portion of the outer sidewall part of the through-electrode 20. A portion of the buried pad 60 formed in the inside of the through-electrode 20 may be disposed on the isolated semiconductor pillar 109. In other words, a height of the isolated semiconductor pillar 109 may be smaller than a height of the through-electrode 20.

Figure 7:
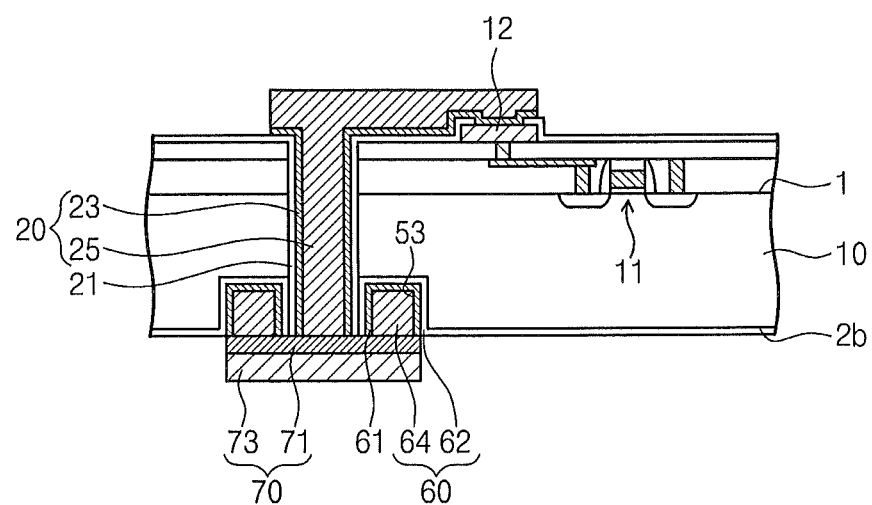
FIG. 7 is a cross-sectional view illustrating a semiconductor device according to still other embodiments of the inventive concept.

FIG. 7 is a cross-sectional view illustrating a semiconductor device according to still other embodiments of the inventive concept.

Referring to FIG. 7, a conductive pad 12 connected to the integrated circuits 11 may be disposed on the second interlayer insulating layer 33. The through-electrode 20 penetrating the semiconductor substrate 10 may extend onto a top surface of the conductive pad 12. In the present embodiment, a portion of the through-electrode 20 may be an interconnection connected to the integrated circuits 11. The via-insulating layer 21 may extend between the extending portion of the through-electrode 20 and the second interlayer insulating layer 33 and between the extending portion of the through-electrode 20 and the conductive pad 12.

A method of forming a semiconductor device according to embodiments will be described hereinafter. FIGS. 8 to 18 are cross-sectional views illustrating a method of forming a semiconductor device according to some embodiments of the inventive concept.

Figure 8:
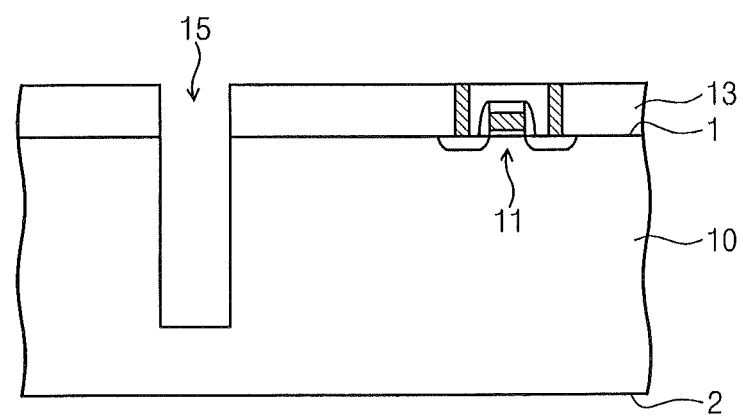
FIGS. 8 to 18 are cross-sectional views illustrating a method of forming a semiconductor device according to some embodiments of the inventive concept.

Referring to FIG. 8, a semiconductor substrate 10 may be prepared. The semiconductor substrate 10 includes a first surface 1 and a second surface 2 opposite to each other. Integrated circuits 11 may be formed on the first surface 1 of semiconductor substrate 10. The integrated circuits 11 may include a memory element, a core circuit element, a peripheral circuit element, a logic circuit element, and/or a control circuit element. The integrated circuits 11 may be formed by various semiconductor manufacturing processes. In some embodiments, the integrated circuits 11 may include at least one of semiconductor memory devices, such as a dynamic random access memory (DRAM) device, a static random access memory (SRAM) device, and/or a flash memory device. In some other embodiments, the integrated circuits 11 may include at least one of a micro electro mechanical system (MEMS) device, an optoelectronic device, and/or a processor (e.g., central processing unit (CPU), a digital signal processor (DSP)).

A first interlayer insulating layer 13 covering the integrated circuits 11 may be formed on the first surface 1 of the semiconductor substrate 10. The first interlayer insulating layer 13 may include conductive patterns electrically connected to the integrated circuits 11.

A hole 15 may be formed in the first interlayer insulating layer 13 and the semiconductor substrate 10. The hole 15 may be spaced apart from the integrated circuits 11. The hole 15 may be formed by a dry etching process, a wet etching process, a drilling process using a laser, and/or a mechanical drilling process. A depth of the hole 15 may be greater than a thickness of the integrated circuits 11. A bottom surface of the hole 15 may be spaced apart from the second surface 2 of the semiconductor substrate 10. For example, the depth of the hole 15 may be within a range of about 40 µm to about 60 µm. In other embodiments, the hole 15 may have a pipe-shape (i.e., a planar cross section of a ring-shape) as illustrated in FIGS. 4 to 6.

Figure 9:
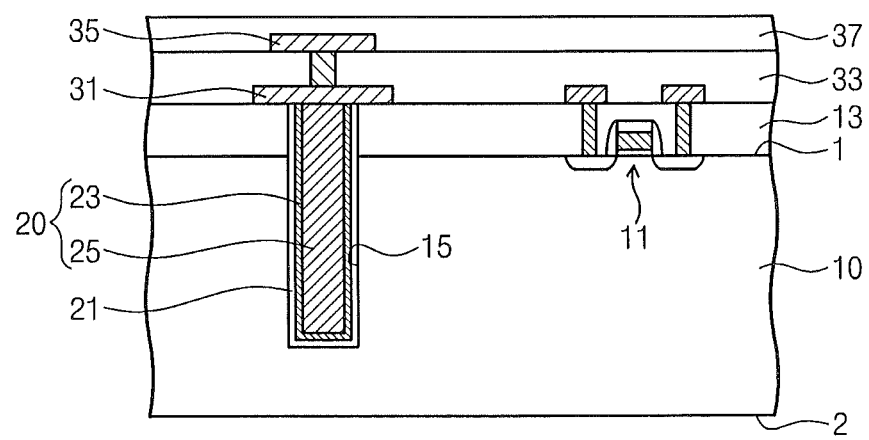

Referring to FIG. 9, a through-electrode 20 may be formed in the hole 15 with a via-insulating layer 21 disposed between the through-electrode 20 and an inner surface of the hole 15.

In more detail, the via-insulating layer 21 may be conformally formed on the first surface 1 of the semiconductor substrate 10 in which the hole 15 is formed. The via-insulating layer 21 may be formed of silicon oxide, silicon oxynitride, silicon nitride, and/or any combination thereof. In other embodiments, the via-insulating layer 21 may be formed of a polymer layer. The via-insulating layer 21 may be formed by a chemical vapor deposition (CVD) process, an atomic layer deposition (ALD) process, and/or a physical vapor deposition (PVD) process.

The through-electrode 20 may fill the hole 15 in which the via-insulating layer 21 is formed. In more detail, forming the through-electrode 20 may include sequentially forming a barrier layer 23 and a metal layer 25 in the hole 15 including the via-insulating layer 21. The metal layer 25 and/or the barrier layer 23 may then be planarized.

The barrier layer 23 may be conformally formed on the via-insulating layer 21. The barrier layer 23 may include titanium, titanium nitride, tantalum, tantalum nitride, ruthenium, cobalt, manganese, tungsten nitride, nickel, nickel boride, a double layer such as titanium/titanium nitride, and/or any combination thereof. The barrier layer 23 may be formed by a CVD process, an ALD process, or a PVD process. The barrier layer 23 may prevent a metal in the metal layer 25 from being diffused into the semiconductor substrate 10.

The metal layer 25 may fill the hole 15 in which the via-insulating layer 21 and the barrier layer 23 are formed. The metal layer 25 may include at least one of silver (Ag), gold (Au), copper (Cu), aluminum (Al), tungsten (W), and/or indium (In). The metal layer 25 may be formed by a plating method and/or a deposition method. If the metal layer 25 is formed by the plating method, a metal seed layer (not shown) may be conformally formed on the barrier layer 23 before the metal layer 25 is formed. The metal seed layer (not shown) may be formed by a sputtering process. The metal seed layer (not shown) may include an alloy layer formed of Ti/Cu, Ti/Pd, Ti/Ni, Cr/Cu, and/or any combination thereof.

The metal layer 25, the barrier layer 23, and the via-insulating layer 21 may be planarized to expose a top surface of the first interlayer insulating layer 13. Thus, the through-electrodes 20 may be formed. In some embodiments, the metal layer 25 and the barrier layer 23 may be planarized to expose a top surface of the via-insulating layer 21.

Subsequently, an internal interconnection 31 may be formed on the through-electrode 20. The internal interconnection 31 may be electrically connected to the integrated circuits 11. A second interlayer insulating layer 33 covering the internal interconnection 31 may be formed on the first interlayer insulating layer 13. A first connecting pad 35 electrically connected to the internal interconnection 31 may be formed on the second interlayer insulating layer 33. The first connecting pad 35 may be electrically connected to the through-electrode 20 through the internal interconnection 31. A passivation layer 37 may then be formed on the second interlayer insulating layer 33 and the first connecting pad 35. The internal interconnection 31 and the first connecting pad 35 may include aluminum, copper, and/or tungsten. The passivation layer 37 may protect the integrated circuits 11 from an external environment. The passivation layer 37 may include an opening exposing a portion of the first connecting pad 35. The passivation layer 37 may include silicon oxide, silicon nitride, a polymer layer (e.g., polyimide), and/or any combination thereof.

In the methods of forming the semiconductor device described above, the through-electrodes 20 may be formed after the formation of the integrated circuits 11. In some embodiments, the through-electrodes 20 may be formed before the integrated circuits 11 are formed. In still other embodiments, the through-electrode 20 may be formed to penetrate the passivation layer 37, the first and second interlayer insulating layers 13 and 33, and the integrated circuits 11.

Subsequently, a thinning process may be performed for reducing a thickness of the semiconductor substrate 10. The thinning process will be described with reference to FIGS. 10 to 12 in detail.

Figure 10:
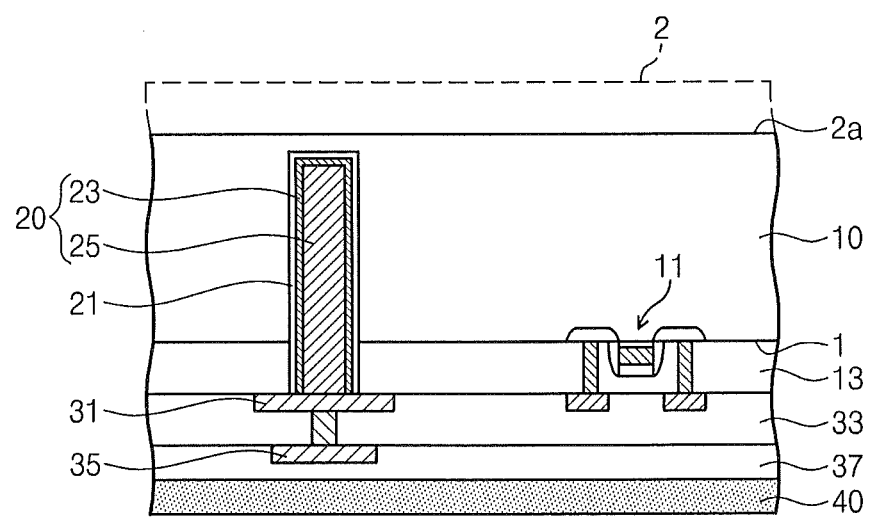

Referring to FIG. 10, a support substrate 40 may be bonded to the first surface 1 of the semiconductor substrate 10 with an adhesion layer (not shown) therebetween. The support substrate 40 may reduce mechanical stress applied to the semiconductor substrate 10 when the second surface 2 of the semiconductor substrate 10 is grinded. Additionally, the support substrate 40 may prevent and/or reduce warpage of the thinned semiconductor substrate 10 after a polishing process for the thinning process. The support substrate 40 may be a glass substrate and/or a resin substrate. The adhesion layer may be an ultraviolet ray-adhesive, a thermoplastic adhesive, and/or an adhesive tape.

Next, a grinding process may be performed on the second surface 2 of the semiconductor substrate 10, thereby thinning the semiconductor substrate 10. In other words, the second surface 2 of the semiconductor substrate 10 may be recessed. At this time, the recessed second surface 2a may be spaced apart from the via-insulating layer 21 and through electrode 20. For example, the semiconductor substrate 10 may be thinned to have the thickness within a range of about 30 µm to about 100 µm by the grinding process.

Figure 11:
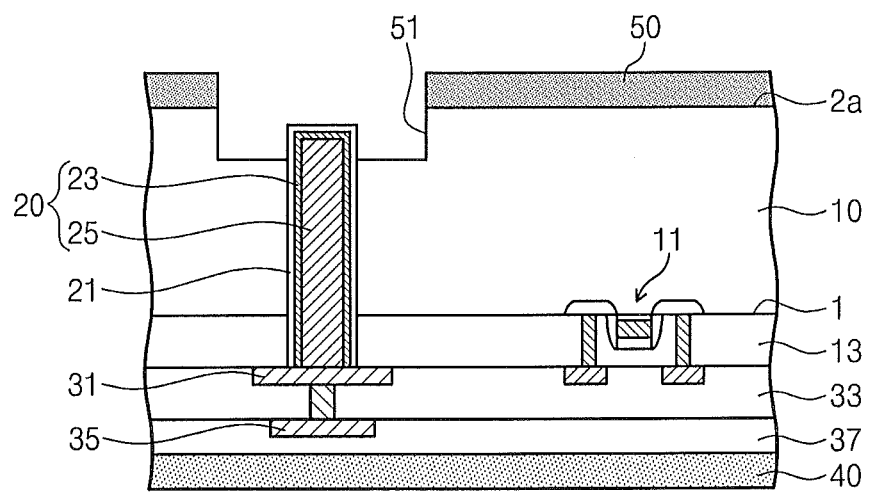

Referring to FIG. 11, a trench 51 may be formed at the recessed second surface 2a of the semiconductor substrate 10. The recessed second surface 2a around the through-electrode 20 may be etched to form the trench 51.

In detail, forming the trench 51 may include forming a mask pattern 50 on the recessed second surface 2a. A portion of the semiconductor substrate 10 may be etched using the mask pattern 50 as an etch mask. The trench 51 may be formed by a wet and/or dry etching process. After the trench 51 is formed, the mask pattern 50 may be removed to expose the recessed second surface 2a. A depth of the trench 51 may be shallower or deeper than the depth of the trench 51 illustrated in FIG. 11. A width of the trench 51 may be narrower or wider than the width of the trench 51 illustrated in FIG. 11. The depth and/or the width of the trench 51 may be varied depending on characteristics and/or process conditions of devices and/or demands of users.

In some embodiments, the depth of the trench 51 may be within a range of about 2 μm to about 3 μm. As described above, the trench 51 is formed, such that a portion of the through-electrode 20 surrounded by the via-insulating layer 21 may protrude from the bottom surface of the trench 51.

Figure 12:
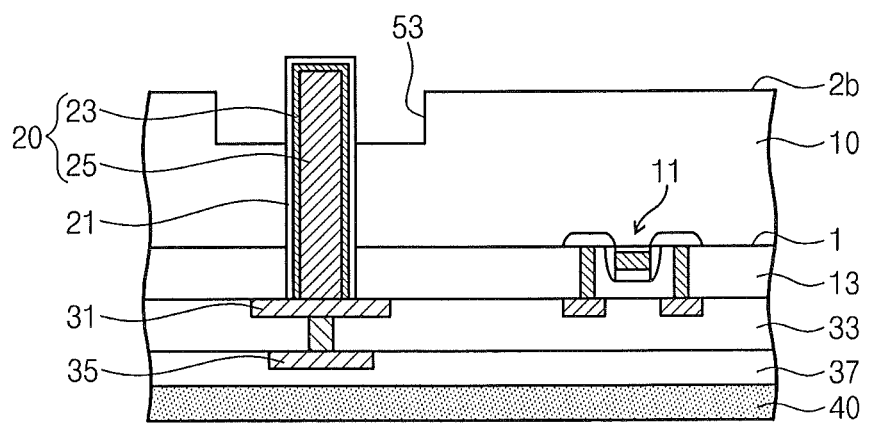

The second surface 2a of the semiconductor substrate 10 may be blanket-etched to form a pad trench 53 around the through-electrode 20 as illustrated in FIG. 12.

Forming the pad trench 53 may include recessing the second surface 2a of the semiconductor substrate 10 of FIG. 11 and the bottom surface of the trench 51 of FIG. 11. Thus, a height of a portion of the through-electrode 20 protruding from a bottom surface of the pad trench 53 may increase. The blanket-etched second surface 2b of the semiconductor substrate 10 may be lower than an end surface of the through-electrode 20 surrounded by the via-insulating layer 21.

Figure 13:
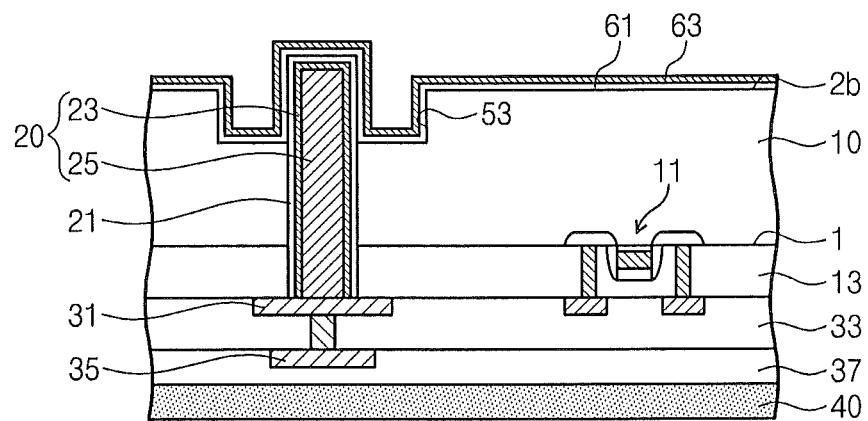

Referring to FIG. 13, a pad insulating layer 61 and a pad barrier layer 63 may be sequentially formed on the pad trench 53 and the protruding through-electrode 20.

The pad insulating layer 61 and the pad barrier layer 63 may be conformally formed on the second surface 2b of the semiconductor substrate 10 including the pad trench 53 and on the via-insulating layer 21 exposed by the pad trench 53.

The pad insulating layer 61 may be formed of silicon oxide, silicon oxynitride, silicon nitride, and/or any combination thereof. The pad insulating layer 61 may be formed by a CVD process, an ALD process, and/or a PVD process.

The pad barrier layer 63 may be conformally formed on the pad insulating layer 61. The pad barrier layer 63 may include titanium, titanium nitride, tantalum, tantalum nitride, ruthenium, cobalt, manganese, tungsten nitride, nickel, nickel boride, a double layer such as titanium/titanium nitride, and/or any combination thereof. The pad barrier layer 63 may be formed by a CVD process, an ALD process, and/or a PVD process. The pad barrier layer 63 may prevent a metal material from being diffused into the semiconductor substrate 10.

Figure 14:
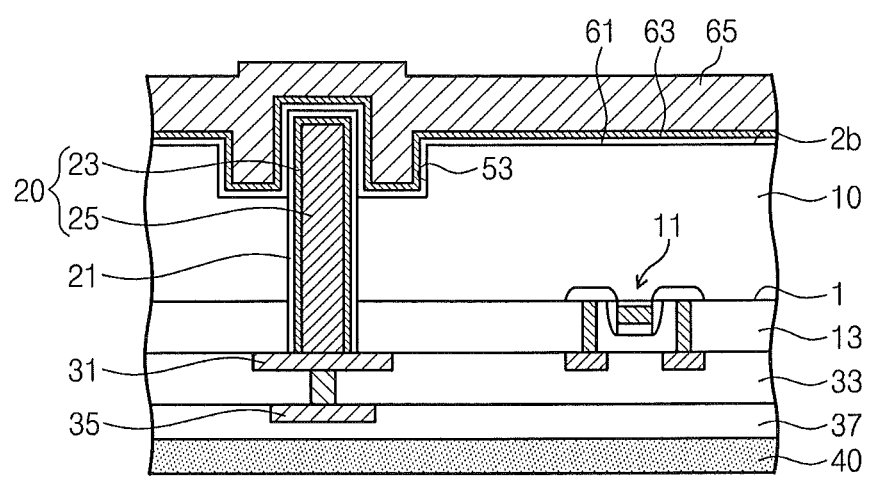

Referring to FIG. 14, a pad metal layer 65 is formed on the pad barrier layer 63. The pad metal layer 65 may fill the pad trench 53 and cover the protruding through-electrode 20.

The pad metal layer 65 may be formed of a metal such as silver (Ag), gold (Au), copper (Cu), aluminum (Al), tungsten (W), and/or indium (In). The pad metal layer 65 may be formed by a plating process or a deposition process. If the pad metal layer 65 is formed by the plating process, a metal seed layer (not shown) may be conformally formed on the pad barrier layer 63 before the pad metal layer 65 is formed. The metal seed layer (not shown) may be formed by a sputtering process. The metal seed layer (not shown) may include an alloy layer formed of Ti/Cu, Ti/Pd, Ti/Ni, Cr/Cu, and/or any combination thereof.

Figure 15:
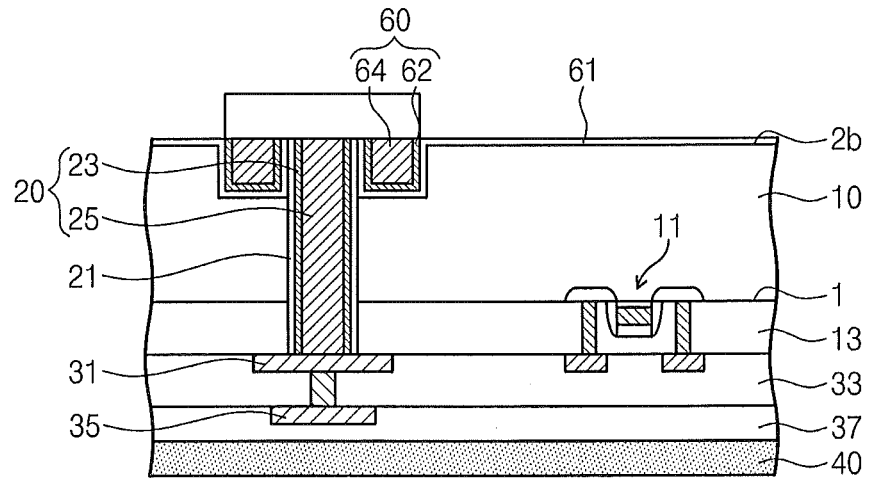

Next, referring to FIG. 15, a planarization process may be performed to form a buried pad 60 in the pad trench 53.

The planarization process performed on the pad metal layer 65 and the pad barrier layer 63 of FIG. 14 may be a chemical mechanical polishing (CMP) process. In some embodiments, the pad insulating layer 61 and/or the second surface 2b of the semiconductor substrate 10 may be used as a planarization stop layer during the CMP process. Thus, the pad barrier pattern 62 and the pad metal pattern 64 may be formed in the pad trench 53.

Additionally, a portion of the through-electrode 20, which protrudes above the second surface 2b of the semiconductor substrate 10, may be removed when the planarization process is performed. In detail, the via-insulating layer 21 surrounding the protruding portion of the through-electrode 20 and the protruding portion of the through-electrode 20 may be removed during the planarization process. Thus, the metal layer 25 of the through-electrode 20 may be exposed.

In some embodiments, the planarized surface of the buried pad 60 may be substantially coplanar with the planarized surface of the through-electrode 20 at the second surface 2b of the semiconductor substrate 10.

According to some embodiments of the inventive concept, the pad metal layer 65 of FIG. 14 may be formed to cover the protruding portion of the through-electrode 20 before the planarization process is performed, so that the pad metal layer 65 of FIG. 14 and the protruding portion of the through-electrode 20 may be planarized together. Thus, it is possible to prevent a mechanical stress from concentrating the protruding portion of the through-electrode 20 during the planarization process. As a result, it is possible to prevent the through-electrode 20 in the semiconductor substrate 10 from being bent or broken.

Figure 16:
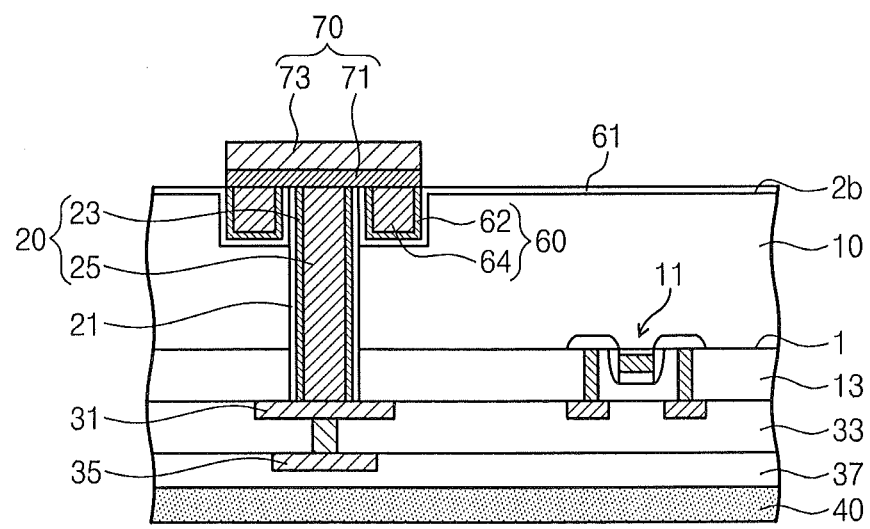

Referring to FIG. 16, a second connecting pad 70 may be formed on top surfaces of the buried pad 60 and the through-electrode 20 after the buried pad 60. A width of the second connecting pad 70 may be substantially equal to or wider than a width of the buried pad 60. The second connecting pad 70 may include a metal seed layer 71 and the metal layer 73 which are stacked. The second connecting pad 70 may be formed by a plating process or a deposition process. The metal seed layer 71 may be formed of an alloy layer formed of Ti/Cu, Ti/Pd, Ti/Ni, Cr/Cu, and/or any combination thereof. The metal layer 73 may be formed of a metal or metal alloy including at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and/or carbon (C).

Figure 17:
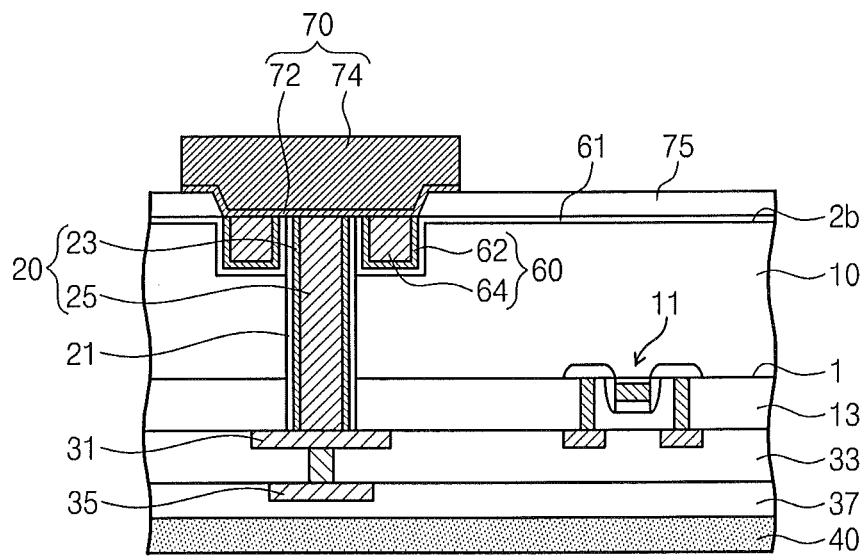

In other embodiments, as illustrated in FIG. 17, a passivation layer 75 may be formed on the buried pad 60. The passivation layer 75 may include an opening exposing top surfaces of the through-electrode 20 and the buried pad 60. The second connecting pad 70 may be formed on the top surfaces of the through-electrode 20 and the buried pad 60 exposed by the opening of the passivation layer 75.

Forming the second connecting pad 70 may include forming a metal base layer 72 and a bump 74. In detail, the metal base layer 72 (i.e., under bump metallurgy (UBM)) may be conformally formed on the passivation layer 75 having the opening. For example, the metal base layer 72 may include an adhesion layer having an excellent adhesive force to the through-electrode 20 and the buried pad 60, a diffusion barrier layer preventing a metal material in the bump 74 from being diffused, and a wettable layer having an excellent wettability to the bump 74 disposed on the metal base layer 72. For example, the adhesion layer may include aluminum (Al), chromium (Cr), and/or titanium (Ti). The diffusion barrier layer may include nickel (Ni). The wettable layer may include silver (Ag), gold (Au), copper (Cu), nickel (Ni), palladium (Pd), and/or platinum (Pt). The metal base layer 72 may be formed using a sputtering process.

Subsequently, a mold (not shown) may be formed on the metal base layer 72 and then the bump 74 may be formed on the metal base layer 72. The bump 74 may be formed of silver (Ag), gold (Au), copper (Cu), nickel (Ni), palladium (Pd), and/or platinum (Pt). After the bump 74 is formed, the metal base layer 74 may be patterned.

Figure 18:
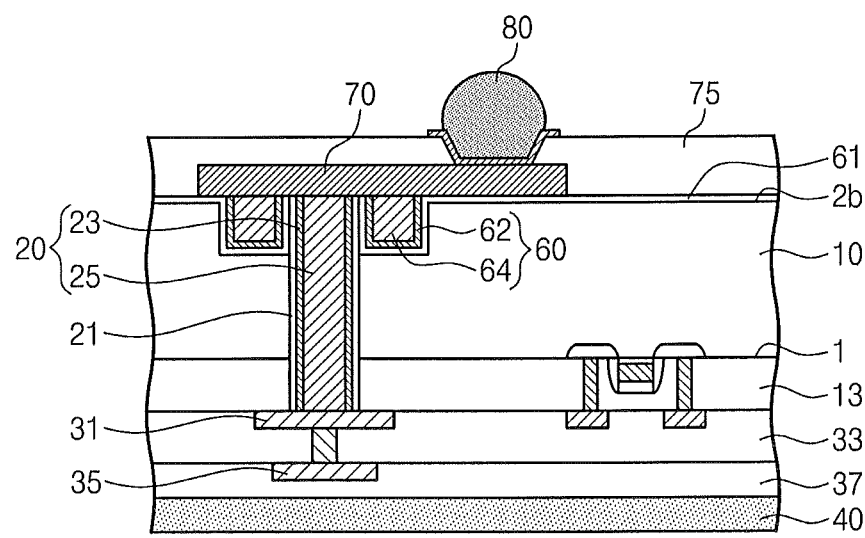

In still other embodiments, as illustrated in FIG. 18, the second connecting pad 70 may be redistribution pattern. Thus, the second connecting pad 70 may electrically connect the through-electrode 20 to a connecting terminal 80 laterally spaced apart from the through-electrode 20. A metal layer may be formed and then be patterned to form the second connecting pad 70. The connecting terminal 80 may be a conductive bump, a solder ball, a conductive spacer, a pin grid array (PGA), or any combination thereof.

As described above, since the second connecting pad 70 is formed on the buried pad 60 of the metal material, it is possible to reduce cracking caused by a weak adhesive force between the second connecting pad 70 and an insulating material if the second connecting pad 70 is formed on the insulating material. In other words, the buried pad 60 may provide stable adhesive force between the second connecting pad 70 and the through-electrode 20.

Hereinafter, various semiconductor packages applied with the semiconductor devices according to some embodiments of the inventive concept will be described with reference to FIGS. 19 to 22 in detail. FIGS. 19 to 22 are cross-sectional views illustrating various semiconductor packages applied with semiconductor devices according to some embodiments of the inventive concept.

Figure 19:
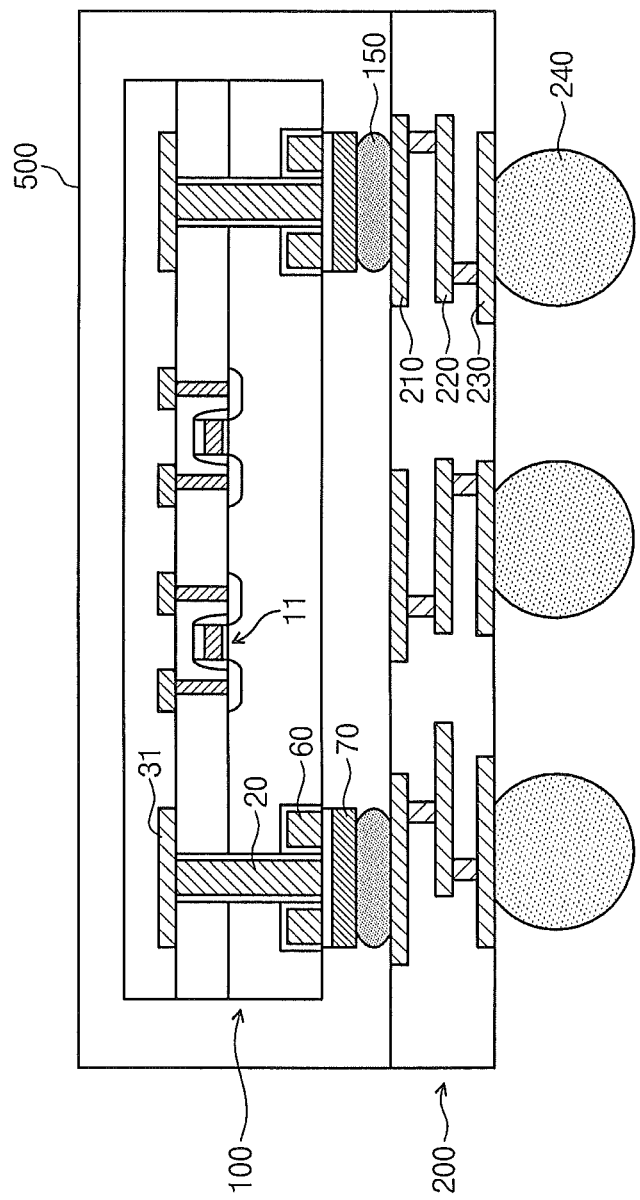
FIGS. 19 to 22 are cross-sectional views illustrating various semiconductor packages applied with semiconductor devices according to some embodiments of the inventive concept.

Referring to FIG. 19, a semiconductor package according to some embodiments may include a semiconductor device 100 mounted on a package board 200.

The semiconductor package may further include a molding layer 500 covering the semiconductor device 100. A portion of the molding layer 500 may be an underfiller filling a space between the package board 200 and the semiconductor device 100. The molding layer 500 may include an epoxy molding compound.

The package board 200 may be one of various kinds of boards such as a printed circuit board, a flexible board, and/or a tape board. The package board 200 may be a flexible printed circuit board and/or a rigid printed circuit board in which a circuit pattern is formed.

The package board 200 has a top surface and a bottom surface. The package board 200 includes bonding pads 210, a core interconnection layer 220, and ball pads 230. The bonding pads 210 may be arranged on the top surface of the package board 200, and the ball pads 230 may be arranged on the bottom surface of the package board 200. The bonding pads 210 may be electrically connected to external connecting terminals 240 through the core interconnection layer 220 and the ball pads 230. The ball pads 230 may be electrically connected to external devices (not shown) through the external connecting terminals 240. The ball pads 230 may transmit electrical signals such as a data signal and a control signal from the external devices (not shown) to the semiconductor device 100. The external connecting terminals 240 may electrically connect the semiconductor package to the external devices (not shown). The external connecting terminals 240 may be solder balls or solder bumps.

The semiconductor substrate 100 is one of the semiconductor devices according to some embodiments of the inventive concepts. Thus, the semiconductor device 100 includes the through-electrode 20 surrounded by the buried pad 60. The semiconductor device 100 may be electrically connected to the package board 200 through first connecting terminals 150. The first connecting terminal 150 may be connected between the first or second connecting pad 31 or 70 and the bonding pad 210 of the package board 200. The first connecting terminal 150 may be one of a conductive bump, a solder ball, a conductive spacer, a pin grid array (PAG), and any combination thereof.

Figure 20:
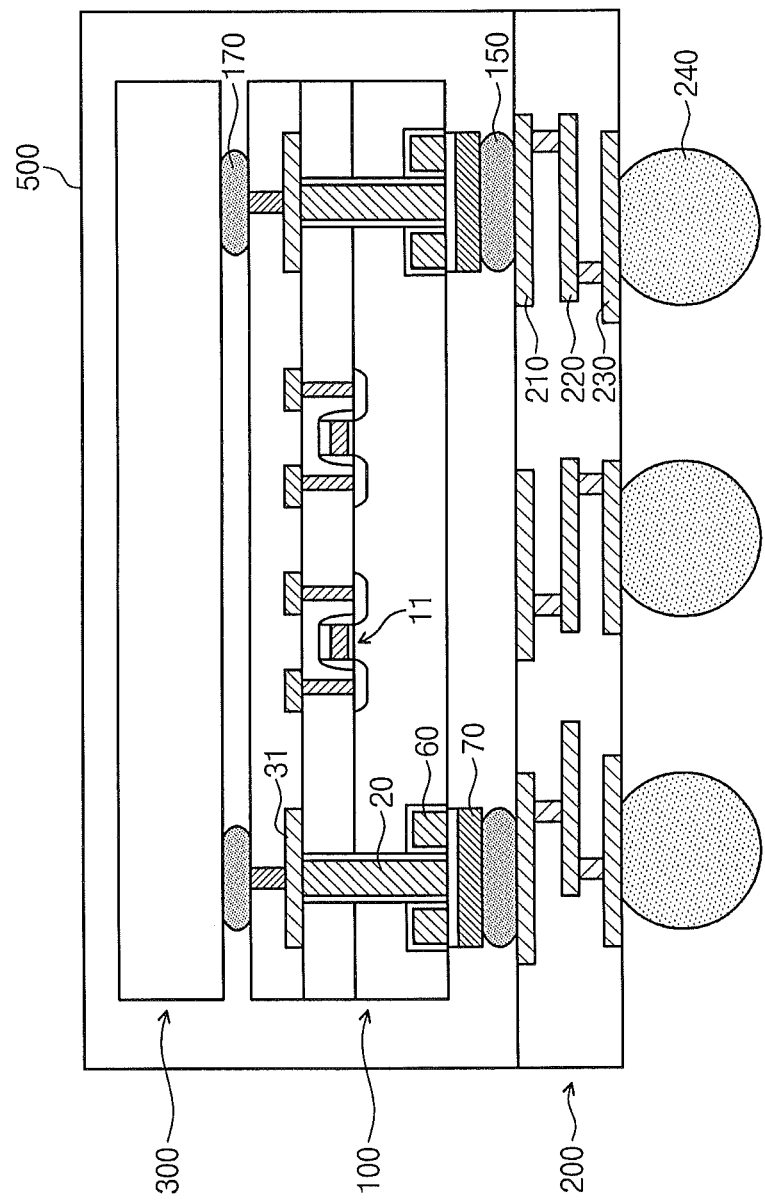

Referring to FIG. 20, a semiconductor package according to some embodiments may include a first semiconductor device 100 and a second semiconductor device 300 sequentially stacked on a package board 200. The semiconductor package may further include a molding layer 500 covering the first and second semiconductor device 100 and 300. Portions of the molding layer 500 may be an underfiller filling a space between the package board 200 and the first semiconductor device 100 and an underfiller filling a space between the first and second semiconductor devices 100 and 300, respectively. The molding layer 500 may include an epoxy molding compound.

The first semiconductor substrate 100 is one of the semiconductor devices according to embodiments of the inventive concepts, so as to include the through-electrode 20 surrounded by the buried pad 60. The second semiconductor device 300 may be a semiconductor device different from the first semiconductor device 100. The second semiconductor device 300 may not include a through-electrode.

Sizes of the stacked first and second semiconductor devices 100 and 300 may be equal to or different from each other. Additionally, all of the first and second semiconductor devices 100 and 300 may memory chips or non-memory chips. In some embodiments, the first semiconductor device 100 may be a memory chip and the second semiconductor device 300 may be a non-memory chip.

The memory chips may have the same kind of memory circuits or various kinds of memory circuits. For example, the memory circuits may include at least one of a DRAM circuit, a SRAM circuit, a programmable read only memory (PROM) circuit, an erasable PROM (EPROM) circuit, an electrically EPROM (EEPROM) circuit, a flash memory circuit, a phase change random access memory (PRAM) circuit, a resistive RAM (RRAM) circuit, a magnetic RAM (MRAM) circuit, and/or a ferroelectric RAM (FRAM). The non-memory chips may include at least one of a MEMS circuit, an optoelectronic circuit, and/or a processor (e.g., a CPU and/or DSP).

The second semiconductor device 300 may be electrically connected to the package board 200 through the first semiconductor device 100. The first semiconductor device 100 may be electrically connected to the package board 200 through first connecting terminals 150. The second semiconductor device 300 may be electrically connected to the first semiconductor device 100 through second connecting terminals 170.

Figure 21:
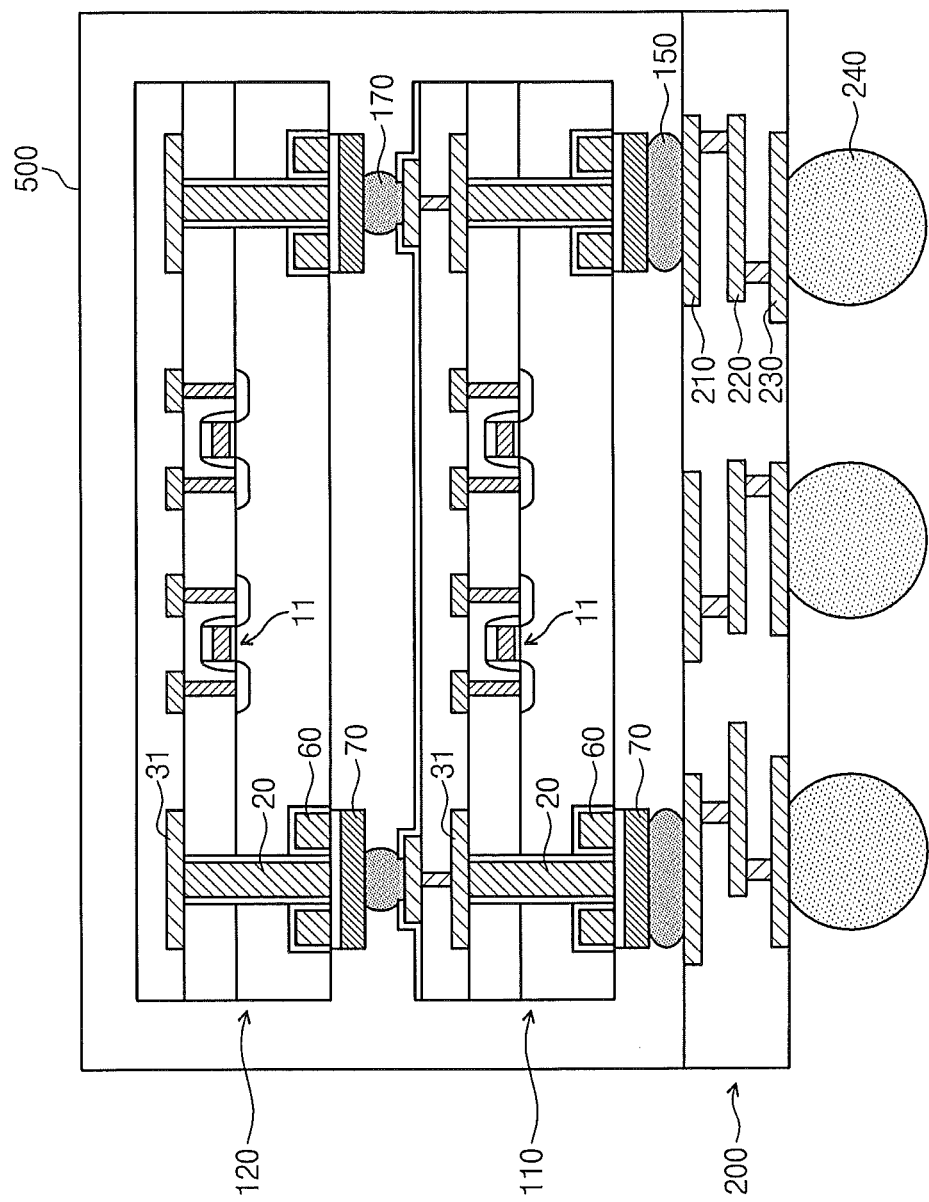

According to an embodiment illustrated in FIG. 21, a semiconductor package may be a multi-chip package including stacked semiconductor devices of the same kind and the same structure.

The multi-chip package may include a package board 200, a first semiconductor device 110 on the package board 200, and at least one second semiconductor device 120 on the first semiconductor device 110. The first and second semiconductor devices 110 120 may be the same kind of semiconductor devices. The multi-chip package may further include a molding layer 500 covering the first and second semiconductor devices 110 and 120. Portions of the molding layer 500 may be an underfiller filling a space between the package board 200 and the first semiconductor device 110 and an underfiller filling a space between the first and second semiconductor devices 110 and 120, respectively. The molding layer 500 may include an epoxy molding compound.

For example, the first and second semiconductor devices 110 and 120 may be semiconductor devices formed by the forming method according to some embodiments of the inventive concept. Each of the first and second semiconductor devices 110 and 120 may include the through-electrode 20.

The second semiconductor device 120 may be electrically connected to the package board 200 through the first semiconductor device 110. The first semiconductor device 110 may be electrically connected to the package board 200 through first connecting terminals 150. The second semiconductor device 120 may be electrically connected to the first semiconductor device 110 through second connecting terminals 170.

Figure 22:
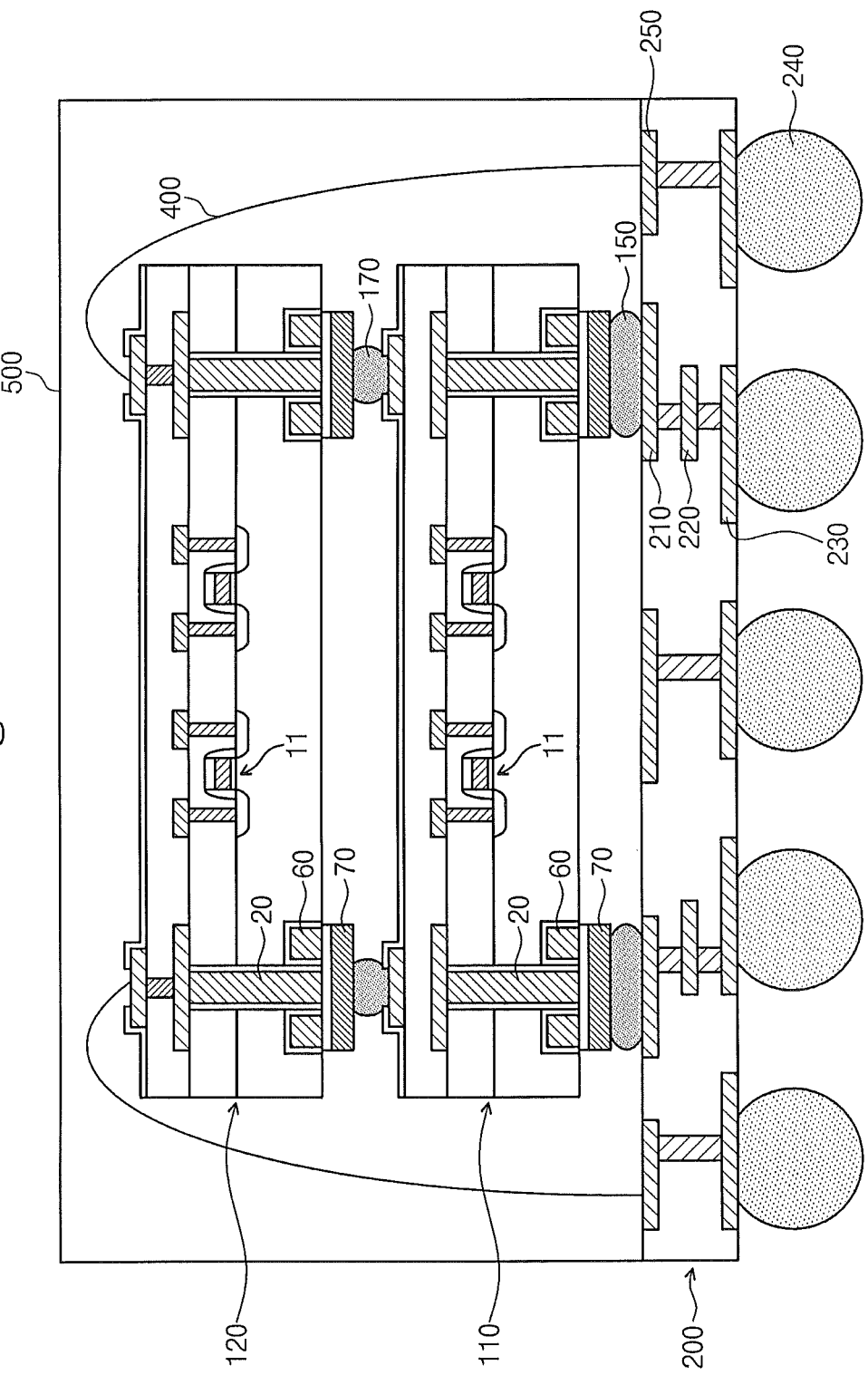

In the semiconductor package illustrated in FIG. 21, the first and second semiconductor devices 110 and 120 may be electrically connected to the package board 200 through the through-electrodes 20. In some embodiments, the second semiconductor device 120 may be electrically connected to the package board 20 through bonding wires 400 as illustrated in FIG. 22.

Figure 23:
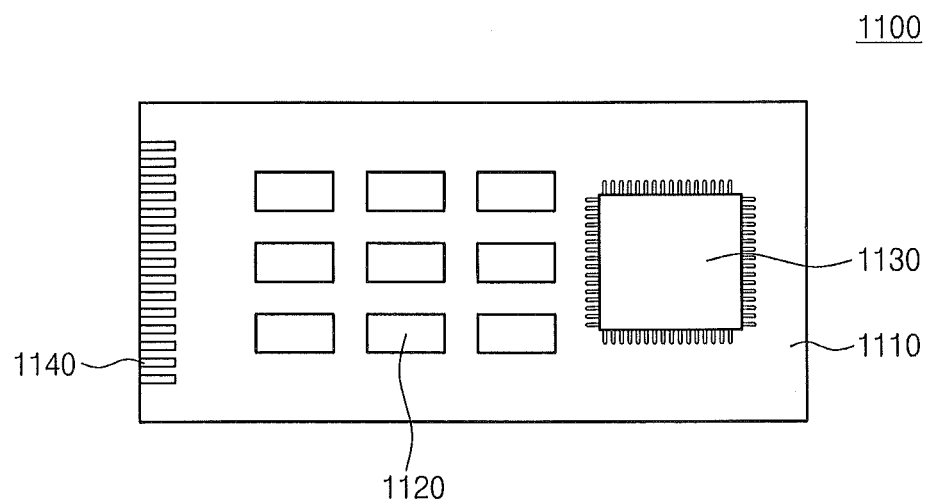
FIG. 23 is a plan view illustrating a package module a semiconductor package according to some embodiments of the inventive concept.

FIG. 23 is a plan view illustrating a package module a semiconductor package according to some embodiments of the inventive concept.

Referring to FIG. 23, a package module 1100 may include a semiconductor integrated circuit chip 1120 and a semiconductor integrated circuit chip 1130 packaged in a quad flat package manner. The semiconductor integrated circuit chips 1120 and 1130 applied with the semiconductor devices according to some embodiments of the inventive concept may be mounted on a board 1110, so that the package module 1100 may be realized. The package module 1100 may be connected to an external electronic device through external connecting terminals 1140.

Figure 24:
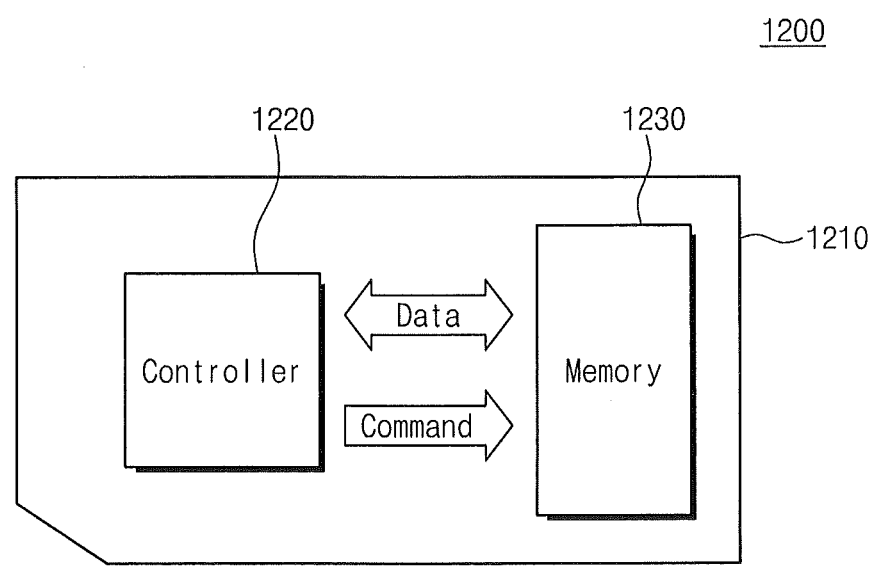
FIG. 24 is a schematic block diagram illustrating an example of memory cards including semiconductor packages according to some embodiments of the inventive concept.

FIG. 24 is a schematic block diagram illustrating an example of memory cards including semiconductor packages according to some embodiments of the inventive concept.

Referring to FIG. 24, a memory card 1200 may include a controller 1220 and a memory device 1230 disposed in a housing 1210. The controller 1220 may exchange electrical signals with the memory device 1230. For example, the memory device 1230 may exchange data with the controller 1220 by command of the controller 1220. Thus, the memory card 1200 may store the data in the memory device 1230 or output the data stored in the memory device 1200 to an external electronic device.

The controller 1220 and/or the memory device 1230 may include at least one of semiconductor devices and semiconductor packages according to some embodiments of the inventive concept. The memory card 1200 may be used as data storage mediums of various portable devices. For example, the memory card 1200 may be used as a multimedia card (MMC) or a secure digital (SD) card, among others.

Figure 25:
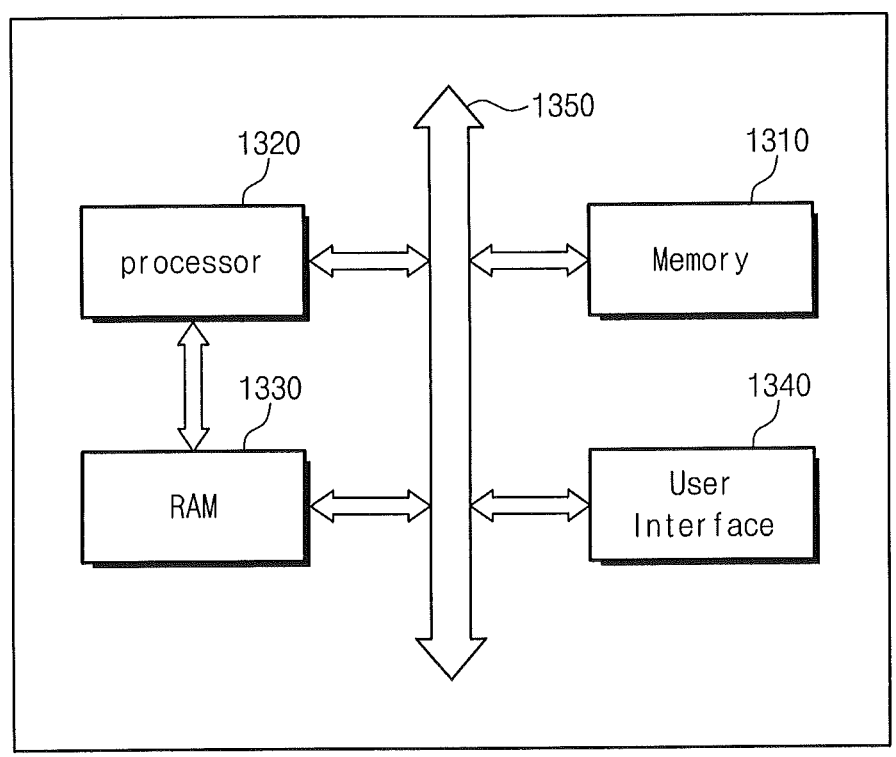
FIG. 25 is a schematic block diagram illustrating an example of electronic systems including semiconductor packages according to some embodiments of the inventive concept.

FIG. 25 is a schematic block diagram illustrating an example of electronic systems including semiconductor packages according to some embodiments of the inventive concept.

Referring to FIG. 25, an electronic system 1300 may include at least one of semiconductor devices and semiconductor packages according to some embodiments of the inventive concept. The electronic system 1300 may include a mobile device or a computer. For example, the electronic system 1300 may include a memory system 1310, a processor 1320, a RAM device 1330, and a user interface unit 1340 which communicate with each other through the data bus 1350. The processor 1320 may execute a program and control the electronic system 1300. The RAM device 1330 may be used as an operating memory of the processor 1320. For example, the processor 1320 and the RAM device 1330 may include the semiconductor devices and the semiconductor packages according to some embodiments of the inventive concept. In some embodiments, the processor 1320 and the RAM device 1330 may be included in one package. The user interface unit 1340 may be used for data input/output of the electronic system 1300. The memory system 1310 may store a code for operating the processor 1320, data processed by the processor 1320, and/or data inputted from an external electronic device. The memory system 1310 may include a controller and a memory device. The memory system 1310 may be the same as the memory card 1200 illustrated in FIG. 24.

The electronic system 1300 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music system, and/or a data transmitting/receiving system. If the electronic system 1300 performs a wireless communication, the electronic system 1300 may use a communication interface protocol such as a third-generation communication system (e.g., CDMA, GSM, NADC, E-TDMA, WCDMA, CDMA2000) and/or a fourth-generation communication system (e.g., LTE, WIBRO).

Figure 26:
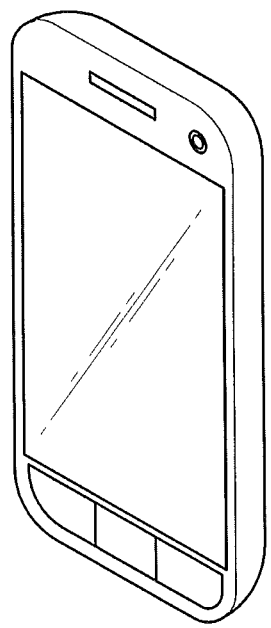
FIG. 26 illustrates a mobile phone applied with an electronic system including a semiconductor package according to some embodiments of the inventive concept.

FIG. 26 illustrates a mobile phone 1400 applied with the electronic system 1300 of FIG. 25 including the semiconductor package according to embodiments of the inventive concept. In other embodiments, the electronic system 1300 of FIG. 25 may be applied to a portable notebook, a MP3 player, a navigation system, a solid state disk (SSD), a car, and/or household appliances.

According to embodiments of the inventive concept, the buried pad is formed to surround the through-electrode in the semiconductor substrate, so that it is possible to prevent the through-electrode from being bent or broken.

Additionally, the connecting pad connected to the through-electrode is formed on the buried pad consisting of the metal material, so that the stable adhesion force may be provided between the connecting pad and the through-electrode. In other words, it is possible to reduce the crack caused between the connecting pad and the insulating layer when the connecting pad is formed on the insulating layer.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:
1. A semiconductor device, comprising:
a semiconductor substrate having a top surface and a bottom surface that is opposite the top surface and a pad trench that is formed at a portion of the bottom surface;
a through-electrode that is configured to penetrate the semiconductor substrate and to protrude from a bottom surface of the pad trench;

a buried pad that is disposed in the pad trench and that substantially surrounds the through electrode;

a conductive connecting pad formed on the bottom surface of the semiconductor substrate and that contacts the through-electrode and the buried pad; and a pad insulating layer that is disposed between the through-electrode and the buried pad.

2. The semiconductor device according to claim 1, wherein an exposed surface of the buried pad is substantially coplanar with an exposed surface of the through-electrode at the second surface of the semiconductor substrate.

3. The semiconductor device according to claim 1, further comprising an interlayer insulating layer formed on the top surface of the semiconductor substrate, wherein the through-electrode is configured to extend through the interlayer insulating layer.

4. A semiconductor device, comprising:

a semiconductor substrate having a top surface and a bottom surface that is opposite the top surface and a pad trench that is formed at a portion of the bottom surface;

a through-electrode that is configured to penetrate the semiconductor substrate and to protrude from a bottom surface of the pad trench;

a buried pad that is disposed in the pad trench and that substantially surrounds the through electrode;

a conductive connecting pad formed on the bottom surface of the semiconductor substrate and that contacts the through-electrode and the buried pad; and an interlayer insulating layer formed on the top surface of the semiconductor substrate, wherein the through-electrode is configured to extend through the interlayer insulating layer, wherein the interlayer insulating layer comprises a first interlayer insulating layer, further comprising:

a second interlayer insulating layer that is formed on the first interlayer insulating layer; and an internal interconnection that is disposed on the first interlayer insulating layer and within the second interlayer insulating layer.

5. The semiconductor device according to claim 1, further comprising:

a via-insulating layer disposed between the through-electrode and the semiconductor substrate and between the buried pad and the through-electrode.

6. The semiconductor device according to claim 1, further comprising:

a pad insulating layer that is disposed between the buried pad and the semiconductor substrate.

7. The semiconductor device according to claim 1, wherein the buried pad comprises a pad barrier layer and a pad metal layer that are sequentially formed in the pad trench.

8. The semiconductor device according to claim 1, wherein the conductive connecting pad comprises a first conductive connecting pad, the device further comprising:

a second conductive connecting pad that is formed on the top surface of the semiconductor substrate and that contacts the through-electrode proximate the top surface of the semiconductor substrate.

9. The semiconductor device according to claim 1, wherein the through-electrode has a pipe-shape, the device further comprising a semiconductor pillar that is spaced apart from the semiconductor substrate and that is disposed within an interior portion of the through-electrode.

10. The semiconductor device according to claim 9, wherein the buried pad surrounds an inner sidewall and an outer sidewall of the through-electrode.

11. The semiconductor device according to claim 9, wherein a height of the semiconductor pillar is smaller than a height of the through-electrode.

12. A semiconductor device comprising:

a through-electrode that is configured to penetrate a semiconductor substrate; and a conductive pad structure that is in contact with a top surface of the through-electrode on the semiconductor substrate and that substantially surrounds a portion of a sidewall of the through-electrode, wherein the conductive pad structure comprises a buried portion and a pad portion, wherein the buried portion of the conductive pad structure is buried in the semiconductor substrate to substantially surround the portion of the sidewall of the through-electrode, and wherein the pad portion of the conductive pad structure is in contact with a top surface of the through-electrode and a top surface of the buried portion, wherein the conductive pad structure further comprises a pad insulating layer and a via-insulating layer, wherein the pad insulating layer is disposed between the buried portion and the semiconductor substrate, and wherein the via-insulating layer is disposed between the through-electrode and the semiconductor substrate and between the buried portion and the through-electrode.

13. The semiconductor device according to claim 12, wherein a top surface of the conductive pad structure is disposed to be higher than a surface of the semiconductor substrate; and wherein a bottom surface of the conductive pad structure is disposed to be lower than the surface of the semiconductor substrate.

14. The semiconductor device according to claim 12, wherein a width of the pad portion is substantially equal to or greater than a width of the buried portion.

15. The semiconductor device according to claim 12, further comprising a via-insulating layer disposed between the through-electrode and the semiconductor substrate and between the buried pad and the through-electrode.

16. The semiconductor device according to claim 12, wherein a top surface of the semiconductor substrate is substantially coplanar with a top surface of the through-electrode.

* * * * *